(12) United States Patent
Lee et al.

(10) Patent No.: US 9,142,669 B2
(45) Date of Patent: Sep. 22, 2015

(54) THIN FILM TRANSISTOR SUBSTRATE HAVING A THIN FILM TRANSISTOR HAVING MULTIPLE TOP GATES AND ORGANIC LIGHT EMITTING DEVICE USING THE SAME

(71) Applicant: LG Display Co., Ltd., Seoul (KR)

(72) Inventors: Jung Hyun Lee, Paju-si (KR); Won Joon Ho, Jeonju-si (KR); Hong Jae Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/266,227

(22) Filed: Apr. 30, 2014

(65) Prior Publication Data

US 2014/0319498 A1    Oct. 30, 2014

(30) Foreign Application Priority Data

Apr. 30, 2013  (KR) .................. 10-2013-0048286

(51) Int. Cl.

| | | |
|---|---|---|
| H01L 29/08 | (2006.01) |
| H01L 35/24 | (2006.01) |
| H01L 51/00 | (2006.01) |
| H01L 29/10 | (2006.01) |
| H01L 29/04 | (2006.01) |
| H01L 31/00 | (2006.01) |
| H01L 27/14 | (2006.01) |
| H01L 29/15 | (2006.01) |
| H01L 29/78 | (2006.01) |
| H01L 29/786 | (2006.01) |
| H01L 27/32 | (2006.01) |
| H01L 27/12 | (2006.01) |
| H01L 29/417 | (2006.01) |
| H01L 51/40 | (2006.01) |
| H01L 21/00 | (2006.01) |
| H01L 21/84 | (2006.01) |
| H01J 1/62 | (2006.01) |
| H01J 63/04 | (2006.01) |

(52) U.S. Cl.
CPC ........ *H01L 29/7831* (2013.01); *H01L 27/1214* (2013.01); *H01L 27/3244* (2013.01); *H01L 29/41733* (2013.01); *H01L 29/786* (2013.01); *H01L 29/78648* (2013.01)

(58) Field of Classification Search
None
See application file for complete search history.

(56) References Cited

U.S. PATENT DOCUMENTS

| | | |
|---|---|---|
| 2007/0290227 A1 | 12/2007 | Liang et al. |
| 2010/0006835 A1* | 1/2010 | Yoon et al. .................. 257/43 |
| 2011/0133181 A1 | 6/2011 | Yamazaki |
| 2011/0147754 A1 | 6/2011 | Isa et al. |
| 2011/0284837 A1 | 11/2011 | Nishijima |
| 2011/0284852 A1 | 11/2011 | Kim et al. |
| 2012/0007084 A1 | 1/2012 | Park et al. |
| 2012/0280238 A1 | 11/2012 | Kimura |

* cited by examiner

*Primary Examiner* — Michael Jung
(74) *Attorney, Agent, or Firm* — Dentons US LLP

(57) ABSTRACT

A thin film transistor substrate provided with two gate electrodes comprises a thin film transistor including a first gate electrode formed on the substrate; an active layer formed on the first gate electrode; first and second electrodes formed on the active layer; and a second gate electrode formed on the first electrode, the second electrode, and the active layer, wherein the second gate electrode is provided with an opening formed in an area corresponding to at least a part of the second electrode.

18 Claims, 15 Drawing Sheets

THIN FILM TRANSISTOR SUBSTRATE HAVING A THIN FILM TRANSISTOR HAVING MULTIPLE TOP GATES AND ORGANIC LIGHT EMITTING DEVICE USING THE SAME

CROSS REFERENCE TO RELATED APPLICATIONS

This application claims the benefit of the Korean Patent Application No. 10-2013-0048286 filed on Apr. 30, 2013, which is hereby incorporated by reference for all purposes as if fully set forth herein.

BACKGROUND OF THE INVENTION

1. Field of the Invention

The present invention relates to a display device. More particularly, the present invention relates to a thin film transistor applied to a display device.

2. Discussion of the Related Art

A thin film transistor (TFT) is used as a switching device or a driving device, wherein the switching device controls an operation of each pixel in a display device such as a liquid crystal display (LCD) or an organic light emitting device (OLED), and the driving device drives each pixel.

The thin film transistor includes a gate electrode, an active layer, and source/drain electrodes, and may be categorized into a staggered structure and a coplanar structure based on the arrangement of the electrodes.

In the staggered structure, the gate electrode and the source/drain electrodes are arranged up and down on the basis of the active layer, and in the coplanar structure, the gate electrode and the source/drain electrodes are arranged on the same plane.

The thin film transistor of the staggered structure may be divided into a back channel etched (BCE) type and an etch stopper layer (ESL) type depending on a method for forming a channel. Since the etch stopper layer type thin film transistor has an advantage in that an etch stopper layer is formed on the active layer to prevent the active layer from being over-etched, its use has been increased.

FIGS. 1A to 1E are cross-sectional views illustrating a related art process steps of manufacturing an ESL type thin film transistor substrate.

First of all, as shown in FIG. 1A, a gate electrode 20 is formed on a substrate 10, and a gate insulating film 25 is formed on an entire surface of the substrate including the gate electrode 20.

Next, as shown in FIG. 1B, after an active layer 30a and an etch stopper layer 40a are sequentially deposited on the gate insulating film 25, the etch stopper layer 40a is patterned to form a predetermined etch stopper 40 as shown in FIG. 1C. The etch stopper 40 serves as a stopper during a later etching process.

Next, as shown in FIG. 1D, an ohmic contact layer 50a and a source/drain electrode layer 60a are sequentially deposited on the entire surface of the substrate including the etch stopper 40.

Next, as illustrated in FIG. 1E, the source/drain electrode 60a is patterned to form a source electrode 62 and a drain electrode 64, and the ohmic contact layer 50a and the active layer 30a are etched using the source and drain electrodes 62 and 64 as masks, whereby an ohmic contact layer 50 and an active layer 30 are formed at a predetermined pattern.

However, since the aforementioned thin film transistor according to the related art, as shown in FIGS. 1A to 1E, has a single gate structure having one gate electrode 20, it is difficult to obtain output saturation characteristics. In addition, there is a non-negligible gap between transfer curves according to voltages between source and drain of a thin film transistor within a subthreshold region, whereby problems of crosstalk or non-uniform luminance such as spots may occur on a screen. Especially, if the thin film transistor with the single gate electrode structure is applied to the organic light emitting device, a compensation capacity may be deteriorated.

Also, in case of the related art thin film transistor with the etch stopper 40, the thin film transistor is inevitably increased in size due to an overlay rule in between each layer. Due to the increased size of thin film transistor, an overlap area between the gate electrode 20 and the source/drain electrodes 62/64 is increased in size, to thereby increase a capacitance of the thin film transistor.

SUMMARY OF THE INVENTION

Accordingly, the present invention is directed to a thin film transistor substrate and an organic light emitting device using the same, which substantially obviate one or more problems due to limitations and disadvantages of the related art.

An advantage of the present invention is to provide a thin film transistor substrate having two gate electrodes.

Another advantage of the present invention is to provide a thin film transistor substrate that may prevent a short between a gate electrode and a drain electrode from occurring.

Still another advantage of the present invention is to provide a thin film transistor substrate that may reduce increased capacitance of a thin film transistor due to the increase overlay rule.

Further still another advantage of the present invention is to provide an organic light emitting device based on the aforementioned thin film transistor substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a thin film transistor substrate comprises a thin film transistor including a first gate electrode formed on the substrate; an active layer formed on the first gate electrode; first and second electrodes formed on the active layer; and a second gate electrode formed on the first electrode, the second electrode, and the active layer, wherein the second gate electrode is provided with an opening formed in an area corresponding to at least a part of the second electrode.

In another aspect of the present invention, an organic light emitting device comprises a substrate; a first thin film transistor formed on the substrate; a second thin film transistor electrically connected with the first thin film transistor; and an organic light emitting diode connected with the first thin film transistor, wherein at least one of the first thin film transistor and the second thin film transistor includes a first gate electrode formed on the substrate; an active layer formed on the first gate electrode; first and second electrodes formed on the active layer; and a second gate electrode formed on the first electrode, the second electrode, and the active layer and provided with an opening formed in an area corresponding to at least a part of the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The terminologies disclosed in this specification should be understood as follows.

When some structure is formed "on or "above" and "below or under" another structure, it is to be understood that the disclosure includes that these structures are in contact with each other and that a third structure is interposed between the above structures. However, when the term "directly on" or "directly below" is used, it is to be understood to be limited that these structures are in contact with each other.

It is to be understood that the singular expression used in this specification includes the plural expression unless meant differently in the context. The terms such as "first" and "second" are intended to identify one element from another element, and it is to be understood that the scope of the present invention should not be limited by these terminologies.

Also, it is to be understood that terms such as "include" and "has" are intended not to exclude the presence or optional possibility of one or more features, numbers, steps, operations, elements, parts or their combination.

It is to be understood that terms such as "at least one" are intended to include all possible combinations that may be suggested from one or more related elements. For example, "at least one of a first element, a second element and a third element" means combination of all the elements that may be suggested from two or more of the first element, the second element and the third element, as well as each of the first element, the second element and the third element.

Hereinafter, the embodiments of the present invention will be described in detail with reference to the accompanying drawings.

First Embodiment

Hereinafter, a thin film transistor substrate according to a first embodiment of the present invention and a method for manufacturing the same will be described with reference to FIGS. 2 to 4.

Thin Film Transistor Substrate

Figure 1A:
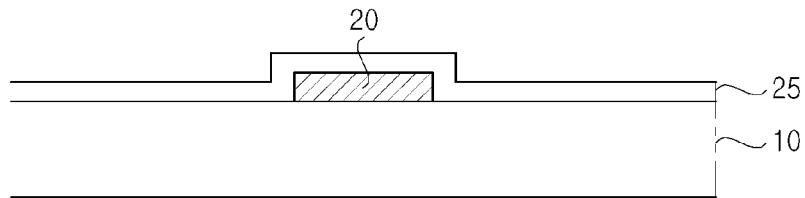
FIGS. 1A to 1E are cross-sectional views illustrating related art process steps of manufacturing an ESL type thin film transistor substrate.
Figure 1B:
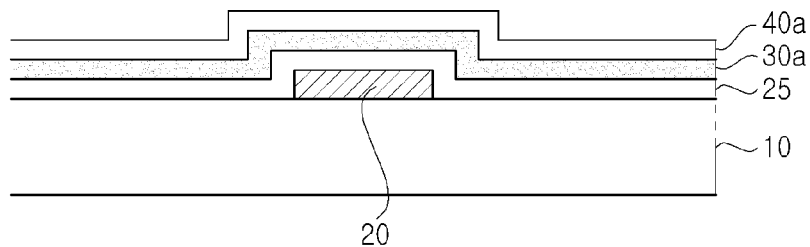
Figure 1C:
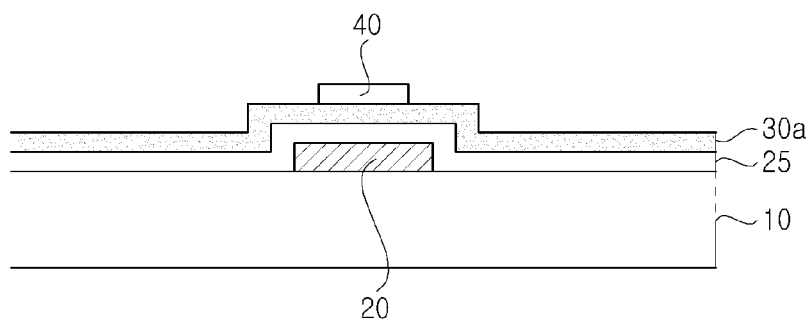
Figure 1D:
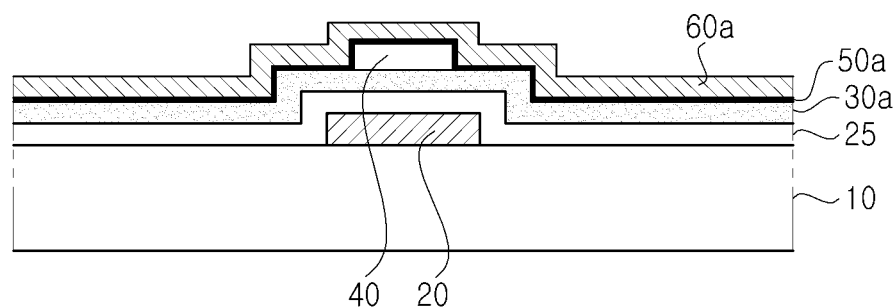
Figure 1E:
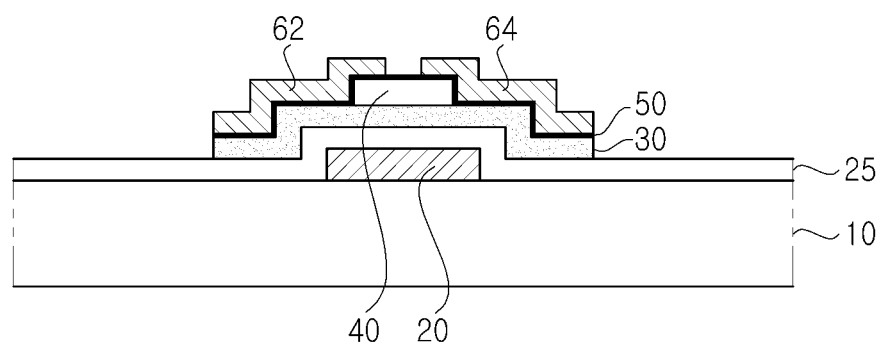
Figure 2A:
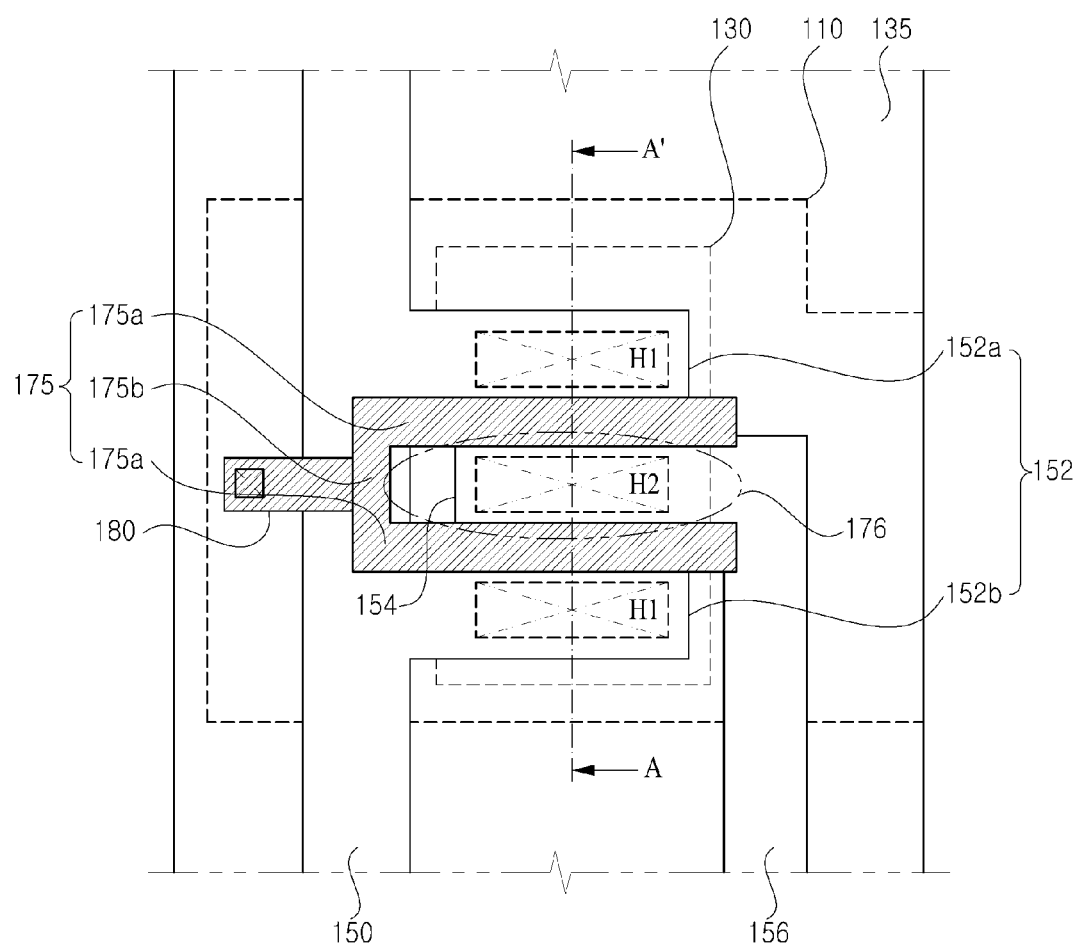
FIG. 2A is a plane view illustrating a thin film transistor substrate according to a first embodiment of the present invention.
Figure 2B:
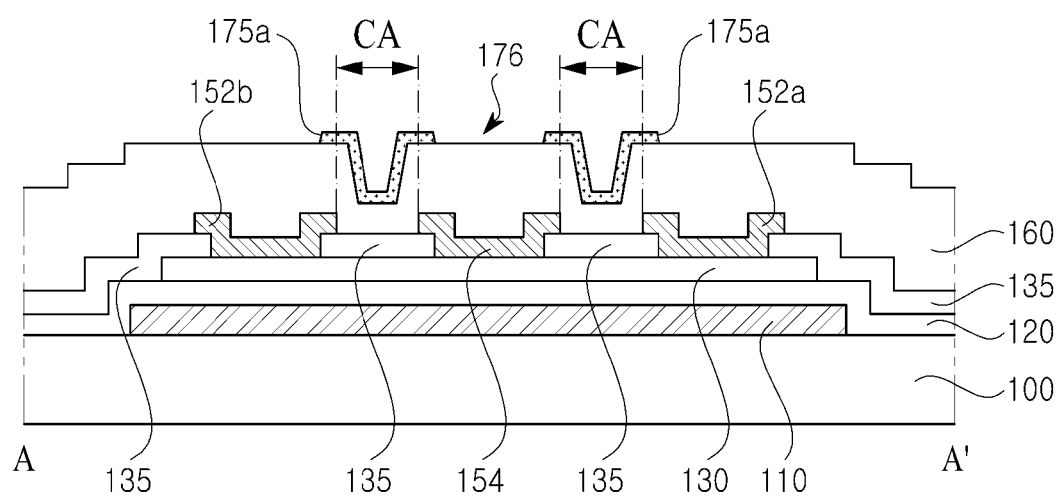
FIG. 2B is a cross-sectional view taken along line A-A' of FIG. 2A.

FIG. 2A is a plane view illustrating a thin film transistor substrate according to the first embodiment of the present invention, and FIG. 2B is a cross-sectional view taken along line A-A' of FIG. 2A.

As shown in FIGS. 2A and 2B, a thin film transistor T, which may serve as a switching device for controlling an operation of each pixel or a driving device for driving each pixel, is formed on the thin film transistor substrate 100 according to the present invention.

The thin film transistor T includes a first gate electrode 110, an active layer 130, an etch stopper layer 135, a first electrode 152, a second electrode 154, and a second gate electrode 175. The thin film transistor T may further include a gate insulating film 120 and a passivation film 160.

The first gate electrode 110 is formed on the thin film transistor substrate. In one embodiment, the first gate electrode 110 may be electrically connected with the second gate electrode 175. This first gate electrode 110 may be diverged from a gate line (not shown).

The gate insulating film 120 is formed on an entire surface of the substrate including the first gate electrode 110.

The active layer 130 is formed on the gate insulating film 120. In one embodiment, the active layer 130 may be formed using, for example, an oxide semiconductor.

The etch stopper layer 135 is intended to prevent the active layer 130 formed therebelow from being over-etched. As shown in FIG. 2A, the etch stopper layer 135 according to the present invention is formed on the entire surface (for example, a line area and a thin film transistor except for an area where a storage capacitor is formed on the substrate) of the substrate 100 including the first gate electrode 110.

The etch stopper layer 135 is provided with a contact hole for contact among the first electrode 152, the second electrode 154, and the active layer 130. At this time, the contact hole includes a first contact hole H1 for contact between the first electrode 152 and the active layer 130, and a second contact hole H2 for contact between the second electrode 154 and the active layer 130.

In one embodiment, a plurality of first contact holes H1 may be formed in accordance with a shape of the first electrode 152 and the second electrode 154. For example, if the first electrode 152 and the second electrode 154 have a "U" type structure as shown in FIG. 2A, two first contact holes H1 for contact between the first electrode 152 and the active layer 130 may be formed, and one second contact hole H2 for contact between the second electrode 154 and the active layer 130 may be formed.

As described above, in the present invention, since the etch stopper layer 135 is deposited on the entire surface of the substrate 100, the etch stopper layer 135 may cover the entire area of the active layer 130 except for the contact areas among the first electrode 152, the second electrode 154, and the active layer 130.

Accordingly, an overlap area among the first gate electrode 110 and the first electrode 152/the second electrode 154 may be reduced. For this reason, in the thin film transistor T according to the present invention, capacitance when the thin film transistor turns on or turns off is reduced as compared with a thin film transistor of which etch stopper layer 135 covers the entire area of the active layer except for a channel area.

Also, since the contact area between the active layer 130 and the first electrode 152/the second electrode 154 is determined by a design rule of the etch stopper layer 135, an overlay rule of the active layer 130 and the first electrode 152/the second electrode 154 has no influence on the left direction (for example, the direction facing from the second electrode 154 toward the first electrode 152a in FIG. 2b) and the right direction (for example, the direction facing from the source electrode 154 toward the first electrode 152b in FIG. 2B).

Also, if the active layer 130 is formed using an oxide semiconductor, passivation of the active layer 130 formed using the oxide semiconductor affects reliability of the thin film transistor T. In case of the present invention, since the entire area of the active layer 130 except for the contact area between the active layer 130 and the first electrode 152/the second electrode 154 as well as the channel area is passivated by the etch stopper layer 135, reliability is improved.

In addition, parasitic capacitance of the thin film transistor T may be minimized due to the aforementioned structure of the etch stopper layer 135, whereby line resistance is also reduced.

Meanwhile, in FIG. 2A, the contact holes for contact between the first electrode 152/the second electrode 154 and the active layer 130 are formed in an area corresponding to the inside of the active layer 130 on the etch stopper layer 135.

Figure 2C:
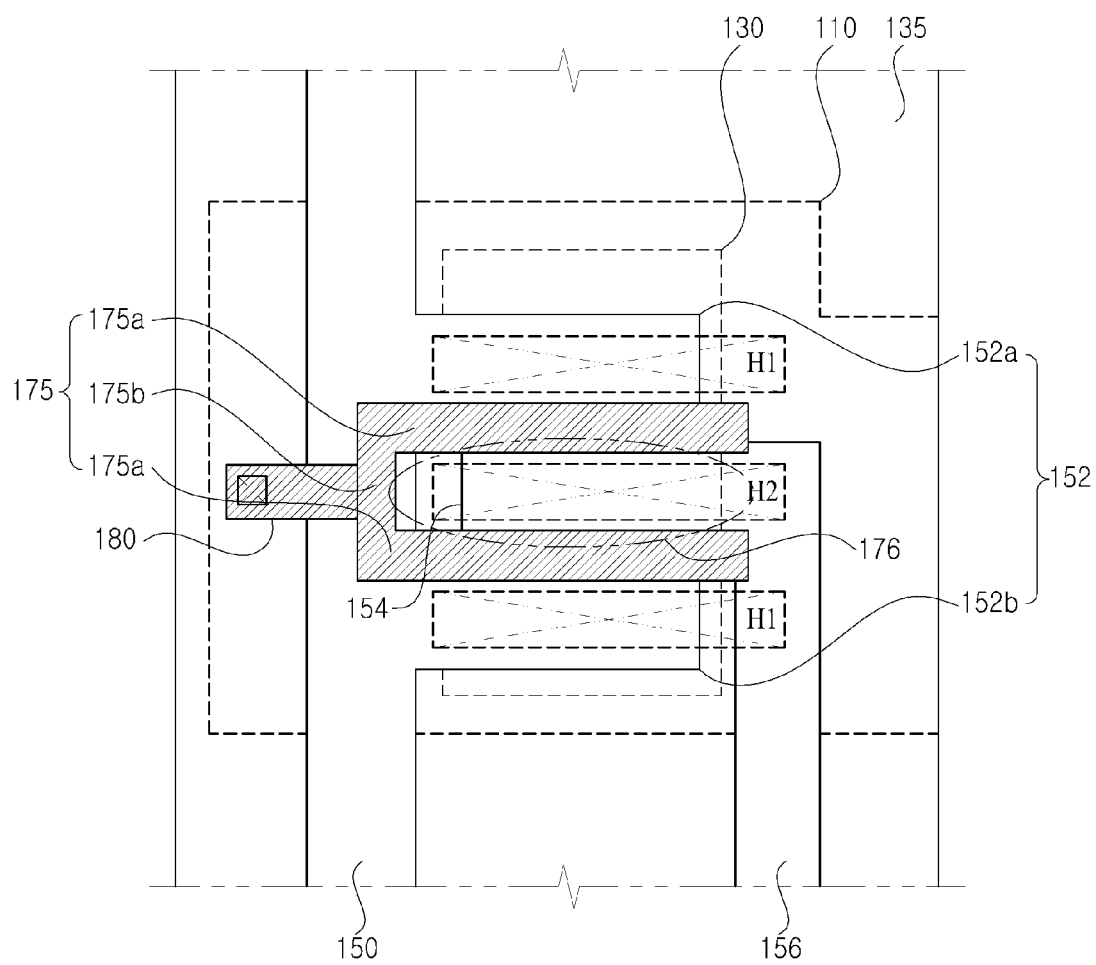
FIG. 2C is a plane view illustrating a thin film transistor substrate according to a first modified embodiment.

However, in a first modified embodiment of the first embodiment, as shown in FIG. 2C, two first contact holes H1 and one second contact hole H2 may be formed to be extended to the area corresponding to the outside of the active layer 130 on the etch stopper layer 135. For this reason, the contact area between the first electrode 152/the second electrode 154 and the active layer 130 may further be extended.

Referring to FIGS. 2A and 2B again, the first electrode 152 is connected with the data line 150. In more detail, the first electrode 152 may be diverged from the data line 150. The second electrode 154 is formed on the active layer 130 to be spaced apart from the first electrode 152 at a predetermined interval while facing the first electrode 152. The channel area (CA) is defined by the first electrode 152 and the second electrode 154.

In one embodiment, the first electrode 152 and the second electrode 154 may be formed in a "U" type structure as shown in FIG. 2A. In this case, the first electrode 152 and the second electrode 154 may be formed in such a manner that the second electrode 154 is arranged between two sub electrodes 152a and 152b constituting the first electrode 152. In this way, as the first electrode 152 and the second electrode 154 are formed in a "U" type structure, an aperture ratio of the pixel may be improved, and parasitic capacitance may be reduced.

At this time, the first electrode 152 may be the source electrode or the drain electrode in accordance with a type of the thin film transistor T. In this case, if the first electrode 152 is the source electrode, the second electrode 154 becomes the drain electrode, and if the first electrode 152 is the drain electrode, the second electrode 154 becomes the source electrode.

Although not shown, an ohmic contact layer may additionally be interposed between the first electrode 152 and the second electrode 154.

Meanwhile, as shown in FIG. 2A, the thin film transistor T according to the present invention may further include a line electrode 156 formed to be extended from the second electrode 154 to electrically connect the thin film transistor T with another circuit device such as another thin film transistor (not shown) or a capacitor (not shown).

The passivation film 160 is formed on the entire surface of the substrate 100 including the first electrode 152 and the second electrode 154.

The second gate electrode 175 is formed on the etch stopper layer 135 to cover the channel area defined by the first electrode 152 and the second electrode 154.

In one embodiment, the second gate electrode 175 is provided with an opening 176 formed in an area corresponding to at least a part of the second electrode 154 as shown in FIGS. 2A and 2B.

If the overlap area between the second gate electrode 175 and the second electrode 154 is increased, the possibility of a short that may occur between the second gate electrode 175 and the second electrode 154 may be increased due to foreign substances existing between the second gate electrode 175 and the second electrode 154, and current efficiency may be deteriorated due to overlap between the second gate electrode 175 and the second electrode 154. For these reasons, according to the present invention, the opening 176 is formed in the second gate electrode 175 to reduce the overlap area between the second gate electrode 175 and the second electrode 154.

A current flowing in the thin film transistor provided with the opening 176 formed in the second gate electrode 175 and a current flowing in the thin film transistor which is not provided with the opening 176 are compared with each other as illustrated in Table 1 below.

TABLE 1

| Gray scale | Thin film transistor of first structure | Thin film transistor of second structure |
|---|---|---|
| 31 | 9.91E−09 | 7.07E−09 |
| 64 | 4.75E−08 | 3.86E−08 |
| 127 | 2.31E−07 | 2.10E−07 |
| 255 | 1.08E−06 | 1.01E−06 |
| Peak | 6.36E−06 | 6.14E−06 |

In table 1, the first structure means the structure of the thin film transistor provided with the opening 176 formed in the second gate electrode 175, and the second structure means the structure of the thin film transistor which is not provided with the opening 176.

Based upon Table 1, even though the same data voltage is applied to these thin film transistors, the current of the thin film transistor provided with the opening 176 formed in the second gate electrode 175 is more increased than that of the thin film transistor which is not provided with the opening 176, whereby current efficiency is improved.

In one embodiment, the opening 176 of the second gate electrode 175 may be formed in such a manner that the overlap area between the second gate electrode 175 and the second electrode 154 is less than 10% of the size of the second gate electrode 175. This is because that current efficiency may be reduced or the possibility of short may be increased if the overlap area between the second gate electrode 175 and the second electrode 154 exceeds 10% of the size of the second gate electrode 175.

The second gate electrode 175 may include a plurality of sub gate electrodes 175a formed on the channel area CA between the first electrode 152 and the second electrode 154 and one or more connection electrodes 175b that connect a plurality of sub gate electrodes 175a with one another. In this case, the opening 176 is defined by an area among the plurality of sub gate electrodes 175a.

In case of the thin film transistor T shown in FIG. 2A, since the first electrode 152 and the second electrode 154 are formed in a "U" type structure, the second gate electrode 175 includes two sub gate electrodes 175a, and one connection electrode 175b that connects two sub gate electrodes 175a with each other. Accordingly, the second gate electrode 175 of the thin film transistor T according to the first embodiment of the present invention includes one opening 176 formed between two sub gate electrodes 175a.

In one embodiment, the connection electrode 175b constituting the second gate electrode 175 may be formed so as not to be overlapped with the line electrode 156 as shown in FIG. 2A.

Figure 2D:
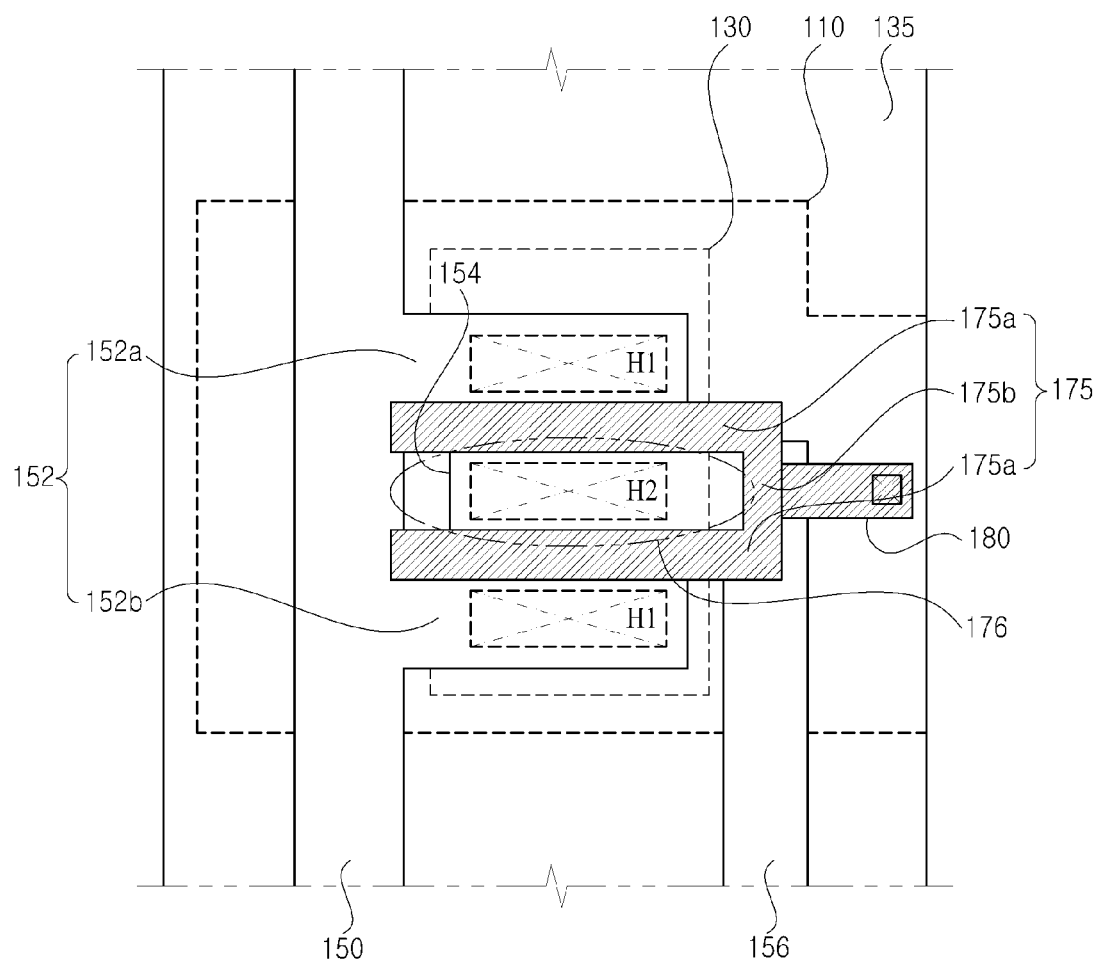
FIG. 2D is a plane view illustrating a thin film transistor substrate according to a second modified embodiment.

In the second modified embodiment of the first embodiment, connection electrode 175b constituting the second gate electrode 175 may be formed to be overlapped with the line electrode 156 as shown in FIG. 2D. According to this embodiment, if a short occurs between the second gate electrode 175 and the second electrode 154, the operation of the corresponding pixel may be stopped by cutting of the connection electrode 175b only, whereby repair may easily be performed. At this time, even in the second modified embodiment, two first contact holes H1 and one second contact hole H2 may be formed to be extended to the area corresponding to the outside of the active layer 130 on the etch stopper layer 135 as shown in FIG. 2C.

In one embodiment, the second gate electrode 175 may be formed using a material different from that of the first gate electrode 110. For example, the second gate electrode 175 may be formed using a material having transparency better than that of the first gate electrode 110.

Meanwhile, the thin film transistor T according to the present invention may further include a contact portion 180 for electrically connecting the first gate electrode 110 with the second gate electrode 175 as shown in FIGS. 2A, 2B and 2D. At this time, since the contact portion 180 has only to electrically connect the first gate electrode 110 with the second gate electrode 175, the contact portion 180 may be formed at a random position within the pixel in the form of various shapes.

For example, the contact portion 180 may be formed using the same material as that of the second gate electrode 175 as shown in FIG. 2A. In this case, the contact portion 180 is formed to be extended from the connection electrode 175b constituting the second gate electrode 175 when the second gate electrode 175 is formed, and electrically connects the first gate electrode 110 with the second gate electrode 175 are exposed through patterning of the gate insulating film 120, the etch stopper layer 135, and the passivation film 160.

For another example, the contact portion 180 may be formed on the same layer as the first electrode 152 and the second electrode 154 by using the same material as that of the first electrode 152 and the second electrode 154. In this case, the contact portion 180 is electrically connected with the first gate electrode 110 exposed through patterning of the gate insulating film 120 and the etch stopper layer 135 in a downward direction, and is directly connected with the second gate electrode 175 through patterning of the passivation film 120 or electrically connected with an electrode (not shown) extended from the second gate electrode 175 in an upward direction. Finally, the contact portion 180 electrically connects the first gate electrode 110 with the second gate electrode 175.

As described above, the thin film transistor T according to the present invention has a dual gate electrode structure in which the first gate electrode 110 is formed below the active layer 130 and the second gate electrode 175 is formed above the active layer 130. The first gate electrode 110 and the second gate electrode 175 of the thin film transistor T are electrically connected with each other through the contact portion 180.

Figure 3A:
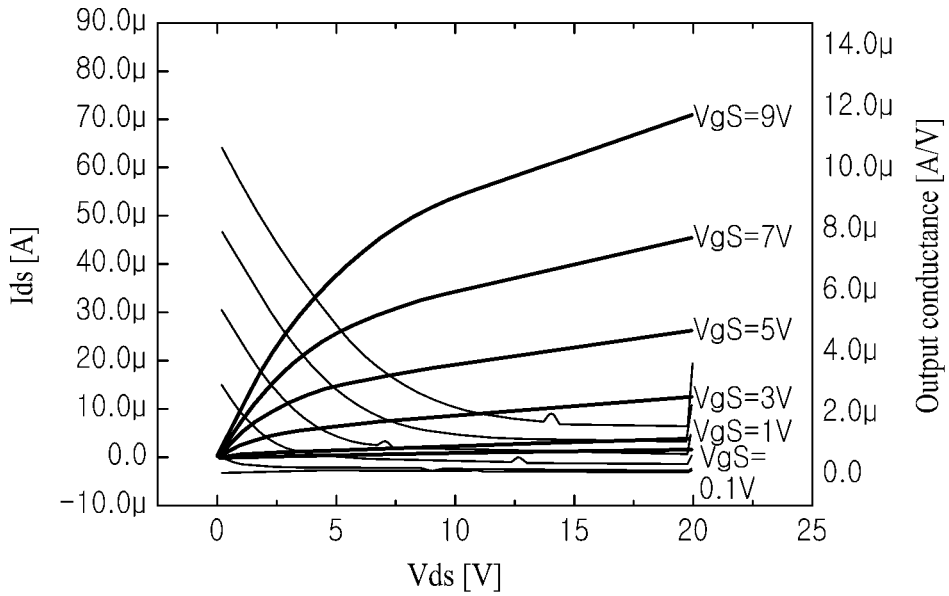
FIG. 3A is a graph illustrating characteristics of a single gate structure thin film transistor.
Figure 3B:
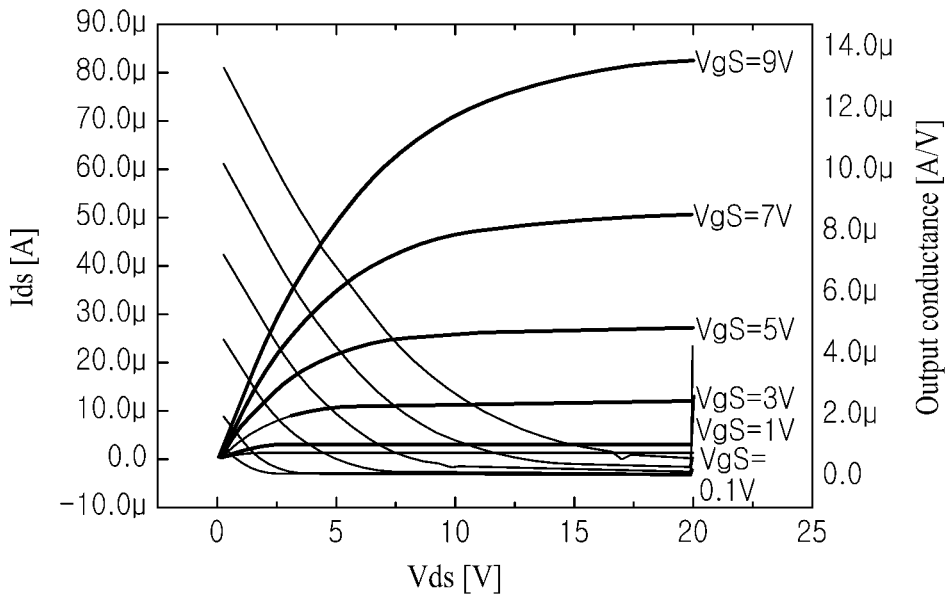
FIG. 3B is a graph illustrating characteristics of a double gate structure thin film transistor according to the present invention.

In accordance with the present invention, and as determined from graphs shown in FIGS. 3A and 3B, output saturation characteristic of the thin film transistor T is more improved than the thin film transistor of the single gate structure, and a gap between transfer curves according to a voltage Vds between the drain and source electrodes of the thin film transistor T within a subthreshold region is more improved than the thin film transistor of the single gate structure. For these reasons, luminance uniformity of the display device, current capability of the thin film transistor T, and compensation capability are improved, and power consumption is reduced.

Also, according to the present invention, since the external light incident on a bottom and a top of the thin film transistor T through the first gate electrode 110 and the second gate electrode 175 is shielded, bias temperature stress (BTS) characteristic of the thin film transistor T may be improved, and external gas ($O_2$) or water ($H_2O$), which flows towards the bottom and the top, is shielded.

Also, according to the present invention, an electric field on the bottom and the top of the thin film transistor is shielded through the first gate electrode 110 and the second gate electrode 175, whereby local and global luminance uniformity is improved and at the same time a bright/blind spot is reduced.

Method for Manufacturing Thin Film Transistor Substrate

Hereinafter, a method for manufacturing a thin film transistor substrate according to the first embodiment of the present invention will be described with reference to FIGS. 4A-4F.

In the following description, for convenience of description, a method for manufacturing the thin film transistor substrate of the structure shown in FIG. 2A will be described.

FIGS. 4A to 4F are cross-sectional views illustrating process steps of manufacturing a thin film transistor substrate according to the first embodiment of the present invention, and correspond to sections taken along line A-A' of FIG. 2A.

Figure 4A:
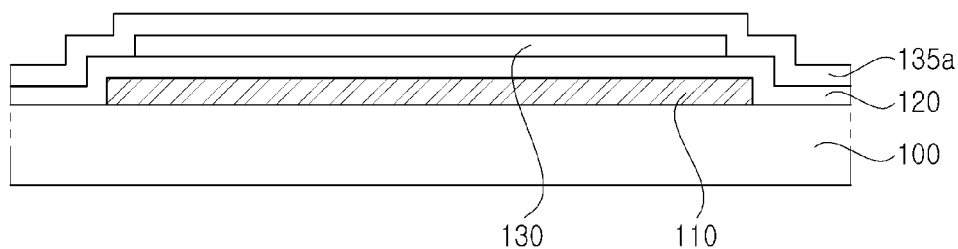
FIGS. 4A to 4F are cross-sectional views illustrating process steps of manufacturing a thin film transistor substrate according to the first embodiment of the present invention.

As shown in FIG. 4A, the first gate electrode 110 is formed on the substrate 100, and the gate insulating film 120 is formed on the entire surface of the substrate including the first gate electrode 110. Afterwards, the active layer 130 is formed on the gate insulating film 120, and a material layer 135a for forming the etch stopper layer 135 on the active layer 130 is formed on the entire surface of the substrate 100.

Figure 4B:
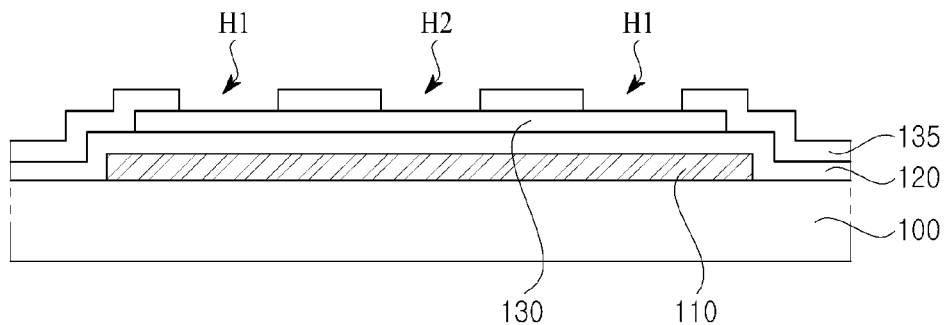

Next, as shown in FIG. 4B, the material layer 135a is patterned to form the etch stopper layer 135 on the active layer 130. In one embodiment, the etch stopper layer 135 having two first contact holes H1 and one second contact hole H2 is formed through such patterning.

Figure 4C:
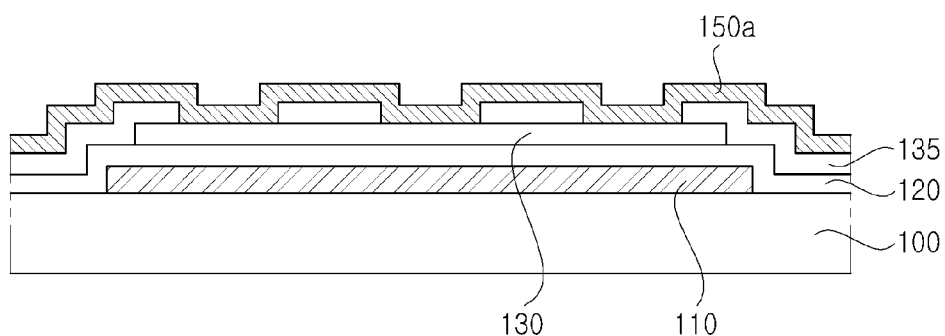

Next, as shown in FIG. 4C, a first and second electrode layer 150a is deposited on the entire surface of the substrate 100 including the etch stopper layer 135.

Figure 4D:
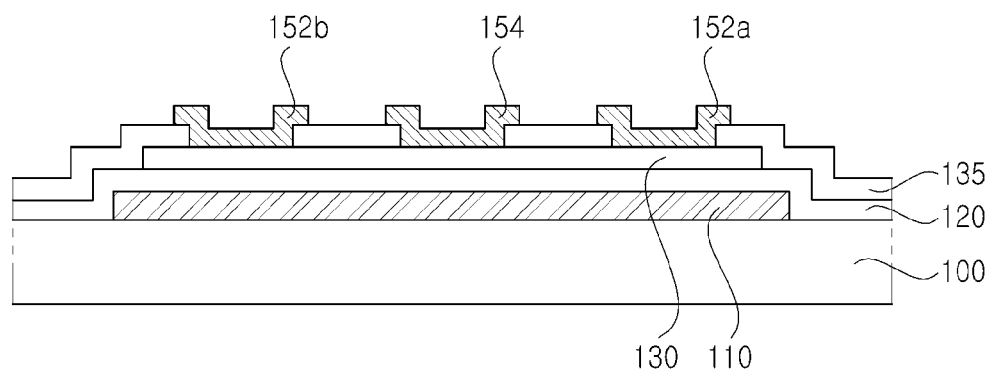

Next, as shown in FIG. 4D, the first and second electrode layer 150a is patterned to form the first electrode 152 and the second electrode 154, which are spaced apart from each other at a predetermined interval.

In one embodiment, the first electrode 152 and the second electrode 154 may be formed in a "U" type structure. Accordingly, the first electrode 152 includes two sub electrodes 152a and 152b, and the second electrode 154 is arranged between the two sub electrodes 152a and 152b.

Meanwhile, although not shown, in forming the first electrode 152 and the second electrode 154, a line electrode (not shown) extended from the second electrode 154 may additionally be formed to connect the thin film transistor with another circuit device (for example, another thin film transistor or capacitor).

Two sub electrodes 152a and 152b constituting the first electrode 152 are contacted with the active layer 130 through two first contact holes H1, and the second electrode 154 is contacted with the active layer 130 through one second contact hole H2.

Figure 4E:
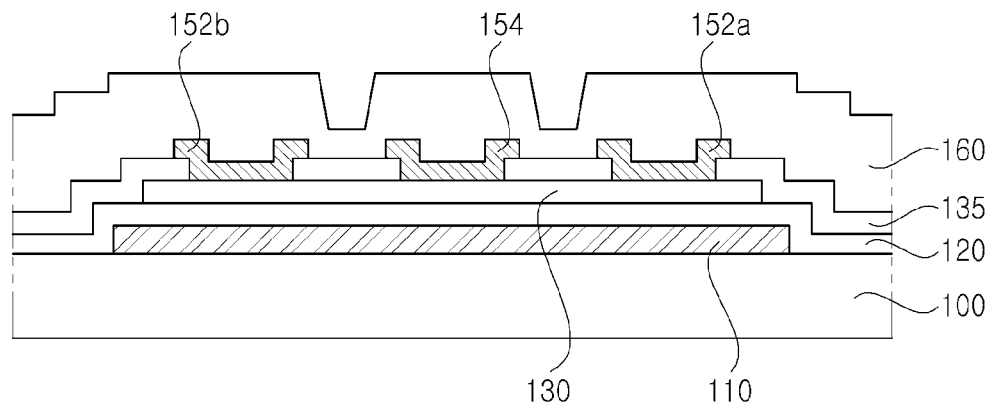

Next, as shown in FIG. 4E, the passivation film 160 is formed on the entire surface of the substrate 100 including the first electrode 152 and the second electrode 154.

Figure 4F:
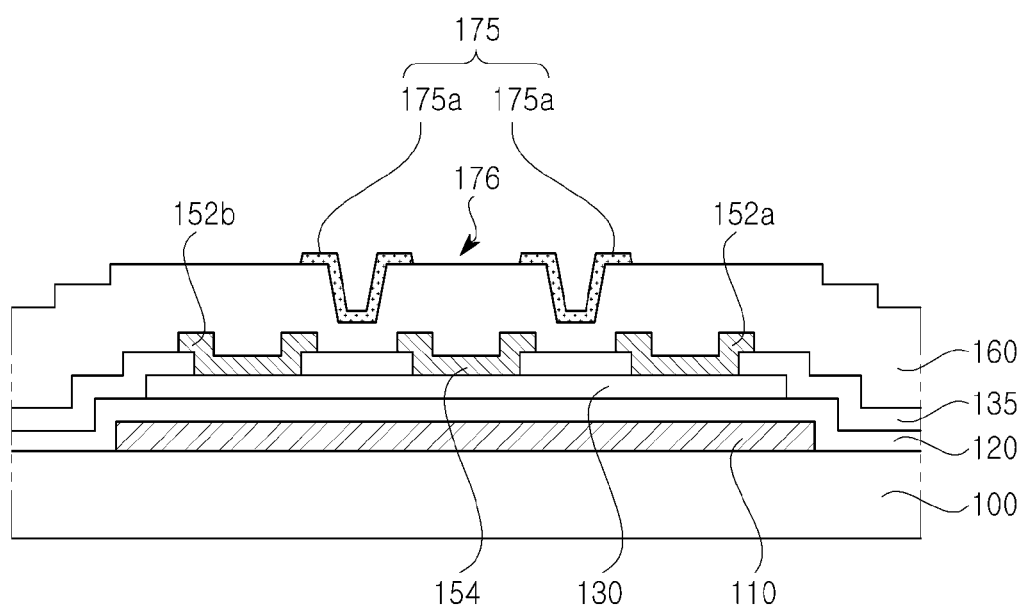

Next, as shown in FIG. 4F, after a material layer (not shown) for forming the second gate electrode 175 is formed on the passivation film 160, the corresponding material layer is patterned to form the second gate electrode 175 having the opening 176 in the area corresponding to at least a part of the second electrode 154. At this time, the second gate electrode 175 is formed on the passivation film 160 to cover the channel area defined by the first electrode 152 and the second electrode 154.

If the overlap area between the second gate electrode 175 and the second electrode 154 is increased, the possibility of short that may occur between the second gate electrode 175 and the second electrode 154 may be increased due to foreign substances existing between the second gate electrode 175 and the second electrode 154, whereby the second gate electrode 175 having the opening 176 is formed to prevent such short from occurring.

In one embodiment, in patterning the second gate electrode 175, the second gate electrode 175 may be formed to have the opening 176 that allows the overlap area between the second gate electrode 175 and the second electrode 154 to be less than 10% of the size of the second gate electrode 175. This is because that current efficiency may be reduced or the possibility of short may be increased if the overlap area between the second gate electrode 175 and the second electrode 154 exceeds 10% of the size of the second gate electrode 175.

Accordingly, the second gate electrode 175 briefly includes two sub gate electrodes 175a arranged by interposing one opening 176 therebetween and one connection electrode (not shown) that connects the two sub gate electrodes 175a with each other.

At this time, in patterning the material layer for forming the second gate electrode 175, the connection electrode constituting the second gate electrode 175 may be formed so as not to be overlapped with the line electrode.

In another embodiment, in patterning the material layer for forming the second gate electrode 175, the connection electrode constituting the second gate electrode 175 may be formed to overlap with the line electrode. In this case, if a short occurs between the second gate electrode 175 and the second electrode 154, the operation of the corresponding pixel may be stopped by cutting of the connection electrode, whereby repair may easily be performed.

Meanwhile, the second gate electrode 175 may be formed using a material different from that of the first gate electrode 110. For example, the second gate electrode 175 may be formed using a material having transparency better than that of the first gate electrode 110.

Meanwhile, although not shown, in performing the steps shown in FIGS. 4A to 4F, the step of forming a contact portion (not shown) for electrically connecting the first gate electrode 110 with the second gate electrode 175 may additionally be performed.

For example, the first gate electrode 110 may be exposed through patterning of the gate insulating film 120, the etch stopper layer 135, and the passivation film 160, and the contact portion may be formed to be extended from the connection electrode 175b constituting the second gate electrode 175 when the second gate electrode 175 is formed, whereby the contact portion 180 is connected with the first gate electrode. Finally, the first gate electrode 110 may be electrically connected with the second gate electrode 175.

Second Embodiment

Thin Film Transistor Substrate

Although the first embodiment has been described with respect to the first electrode 152 and the second electrode 154 having a "U" type structure, the first electrode 152 and the second electrode 154 may be formed in various other structures.

Figure 5A:
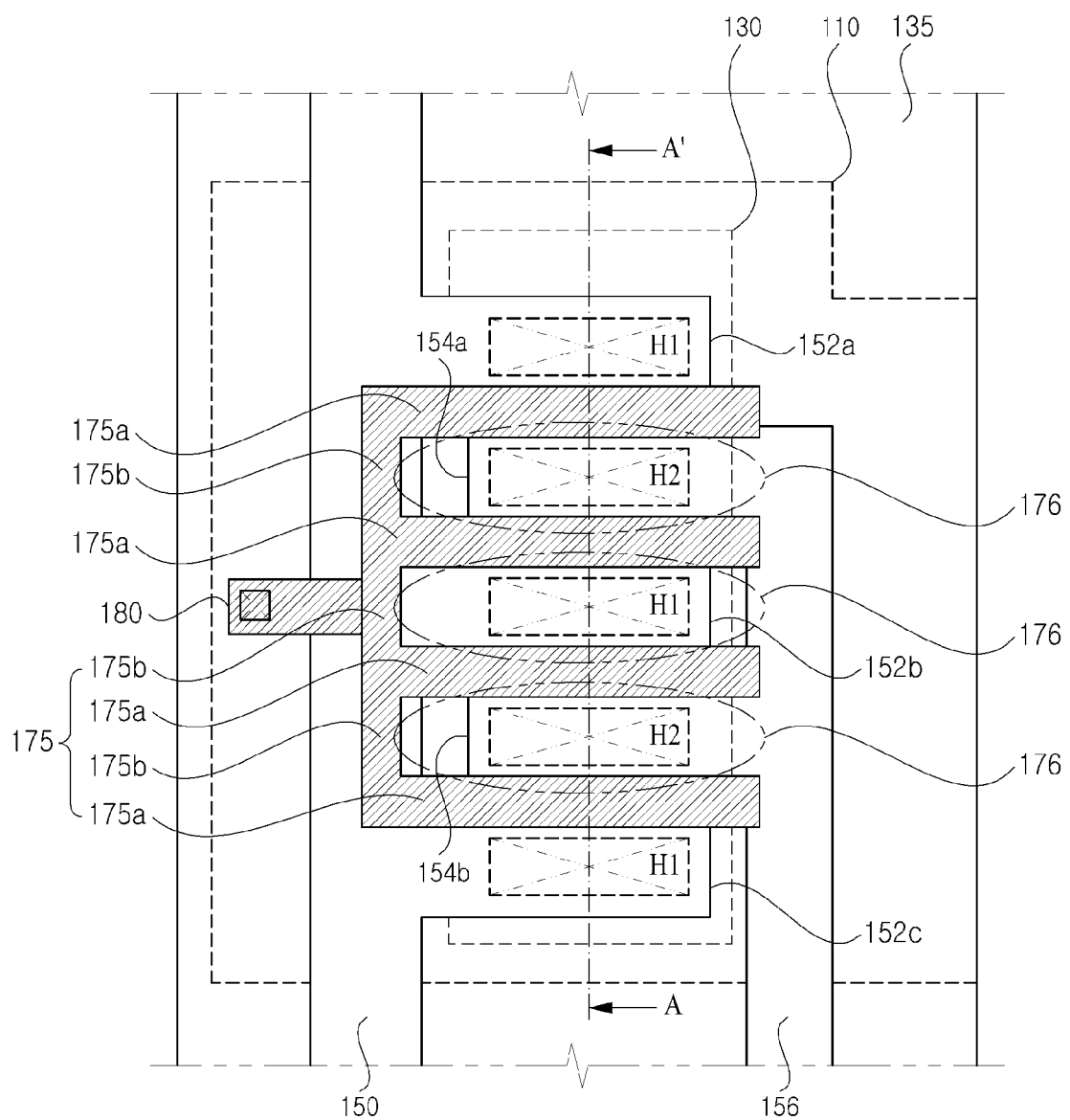
FIG. 5A is a plane view illustrating a thin film transistor substrate according to a second embodiment of the present invention.

For example, the thin film transistor T according to a second embodiment may include the first electrode 152 and the second electrode 154, which are formed in a "W" type structure, as shown in FIG. 5A. Hereinafter, a configuration of the thin film transistor T according to the second embodiment will be described in more detail with reference to FIGS. 5A and 5B.

In the following description, for convenience of description, the description of the configuration of the second embodiment, which is the same as that of the first embodiment, will be omitted. The etch stopper 135, the first electrode 152, the second electrode 154, and the second gate electrode 175, which are different from those of the first embodiment, will briefly be described.

First of all, the etch stopper 135 is provided with a contact hole for contact between the first electrode 152/the second electrode 154 and the active layer 130. At this time, the contact hole includes a first contact hole H1 for contact between the first electrode 152 and the active layer 130, and a second contact hole H2 for contact between the second electrode 154 and the active layer 130.

In one embodiment, since the first electrode 152 and the second electrode 154 have a "W" type structure, the etch stopper layer 135 is provided with three first contact holes H1 for contact with the first electrode 152 and two second contact holes H2 for contact with the second electrode 152.

In FIG. 5A, the contact holes for contact between the first electrode 152/the second electrode 154 and the active layer 130 are formed in an area corresponding to the inside of the active layer 130 on the etch stopper layer 135.

Figure 5B:
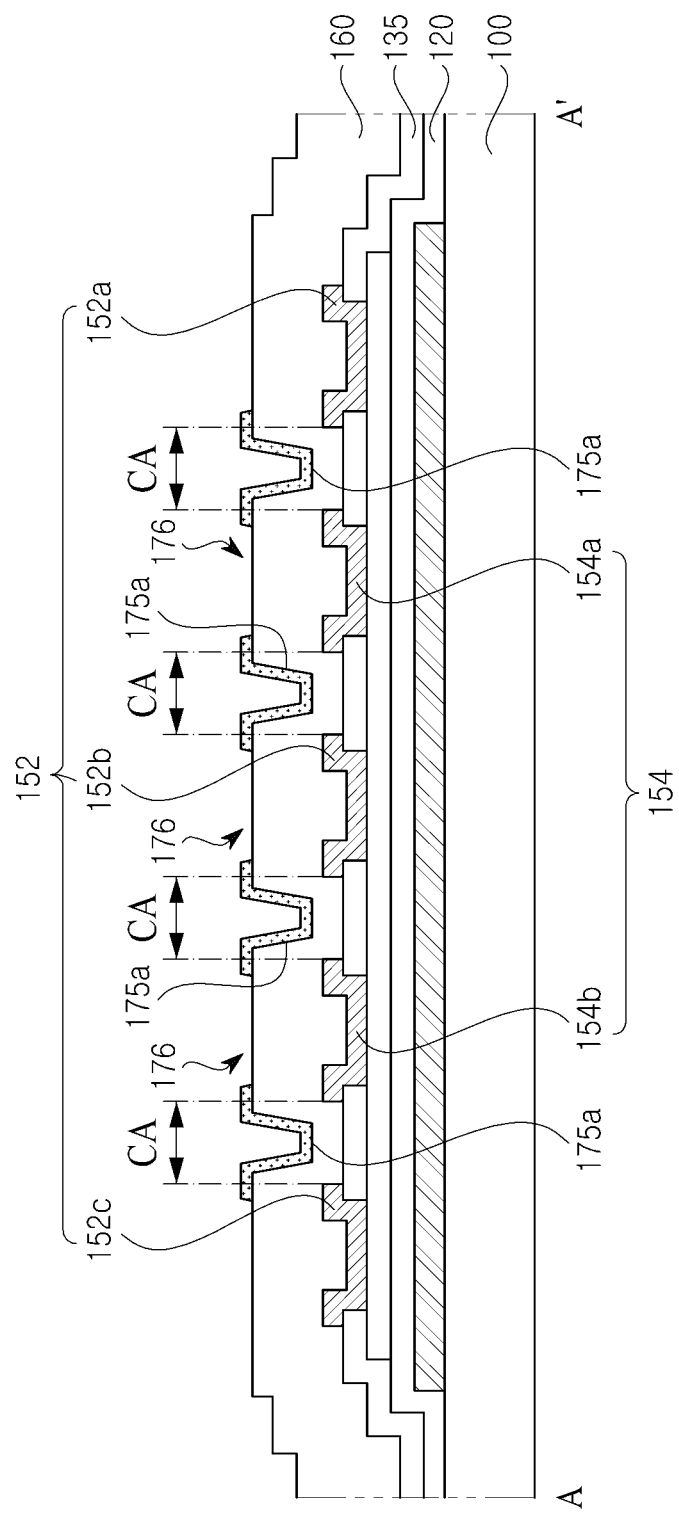
FIG. 5B is a cross-sectional view taken along line A-A' of FIG. 5A.
Figure 5C:
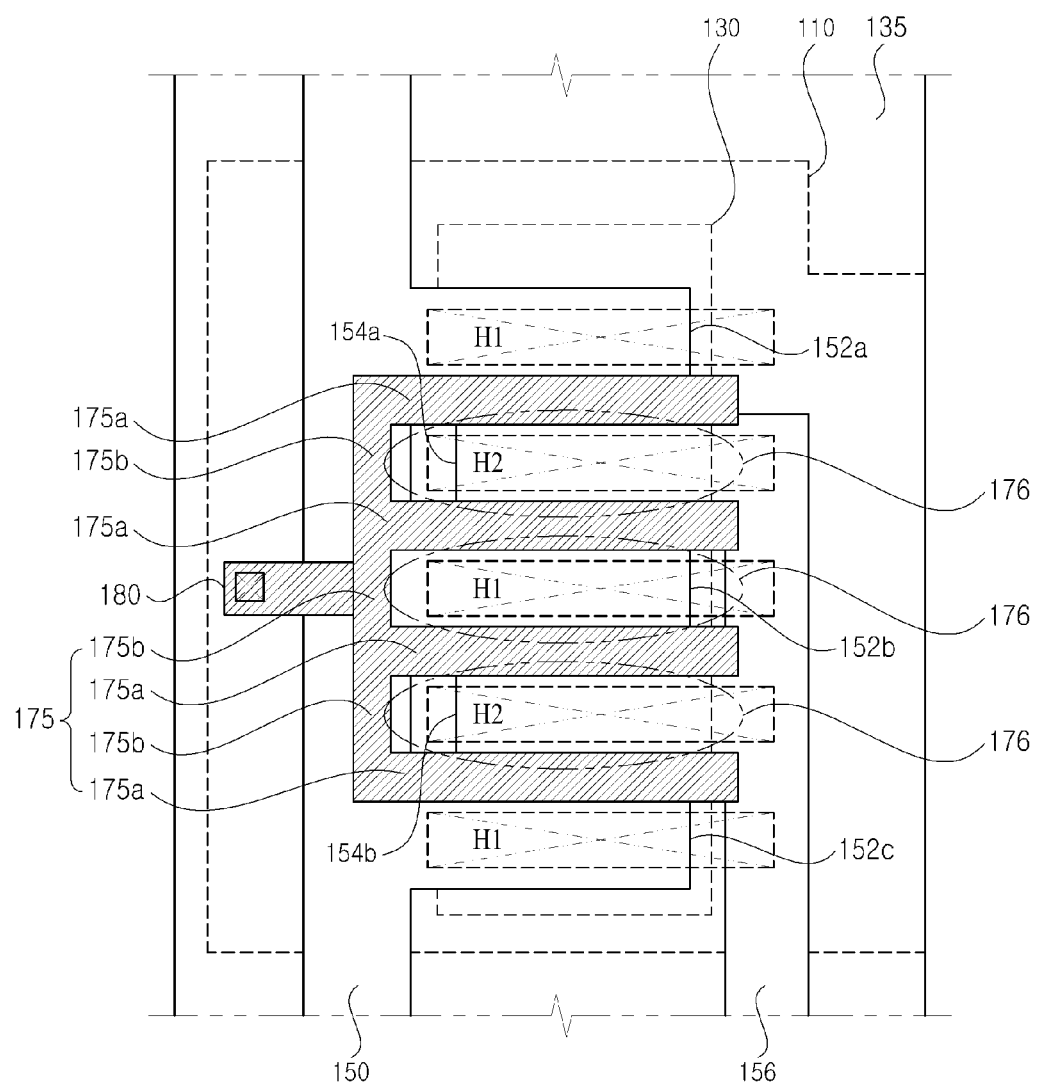
FIG. 5C is a plane view illustrating a thin film transistor substrate according to a third modified embodiment.

However, in a third modified embodiment of the second embodiment, as shown in FIG. 5C, three first contact holes H1 and two second contact hole H2 may be formed to be extended to the area corresponding to the outside of the active layer 130 on the etch stopper layer 135. For this reason, the contact area between the first electrode 152/the second electrode 154 and the active layer 130 may further be extended.

Next, the first electrode 152 and the second electrode 154 are formed in a "W" type structure as shown in FIGS. 5A and 5B. In this case, the first electrode 152 and the second electrode 154 are formed in such a manner that two sub electrodes 154a and 154b constituting the second electrode 154 are arranged among three sub electrodes 152a, 152b and 152c constituting the first electrode 152. In this way, as the first electrode 152 and the second electrode 154 are formed in a "W" type structure, an aperture ratio of the pixel may be more improved than that of the first embodiment, and at the same time parasitic capacitance may further be reduced.

Next, since the first electrode 152 and the second electrode 154 are formed in a "W" type structure, the second gate electrode 175 includes three sub gate electrodes 175a formed on the channel area CA between the first electrode 152 and the second electrode 154, and two connection electrodes 175b that connect the three sub gate electrodes 175a with one another. In this case, the opening 176 is defined by areas among the three sub gate electrodes 175a. Accordingly, the second gate electrode 175 of the thin film transistor T according to the second embodiment includes two opening 176 formed among the three sub gate electrodes 175a.

Even in case of the second gate electrode of the thin film transistor T according to the second embodiment, the openings 176 may be formed in such a manner that the overlap area between the second gate electrode 175 and the second electrode 154 is less than 10% of the size of the second gate electrode 175. This is because that current efficiency may be reduced or the possibility of short may be increased if the overlap area between the second gate electrode 175 and the second electrode 154 exceeds 10% of the size of the second gate electrode 175.

In one embodiment, the two connection electrodes 175b constituting the second gate electrode 175 may be formed so as not to be overlapped with the line electrode 156 as shown in FIG. 5A.

Figure 5D:
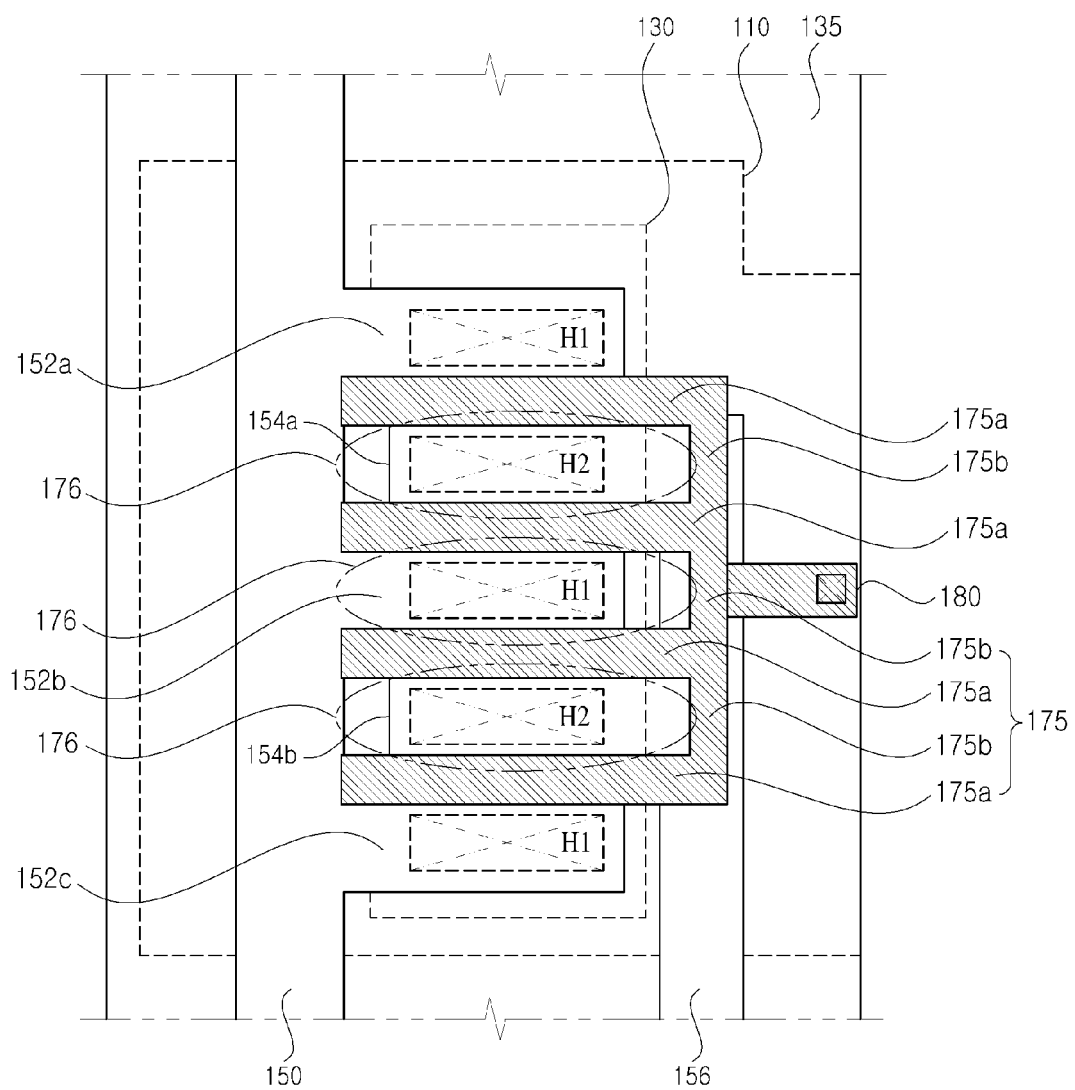
FIG. 5D is a plane view illustrating a thin film transistor substrate according to a fourth modified embodiment.
Figure 6:
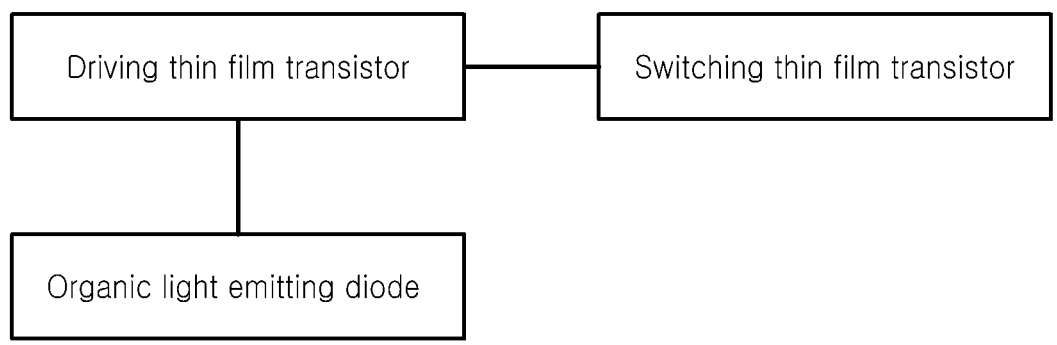
FIG. 6 illustrates connections when TFTs are applied to an organic light emitting device.

In a fourth modified embodiment of the second embodiment, two connection electrodes 175b constituting the second gate electrode 175 may be formed to be overlapped with the line electrode 156 as shown in FIG. 5D. According to this embodiment, if short occurs between the second gate electrode 175 and the second electrode 154, the operation of the corresponding pixel may be stopped by cutting of the connection electrodes 175b, whereby repair may easily be performed.

At this time, even in the fourth modified embodiment, three first contact holes H1 and two second contact holes H2 may be formed to be extended to the area corresponding to the outside of the active layer 130 on the etch stopper layer 135 as shown in FIG. 5C.

Meanwhile, in the aforementioned second embodiment, it has been described that the present invention is applied to the thin film transistor of which first electrode 153 has three sub electrodes 152a, 152b and 152c and second electrode 154 has two sub electrodes 154a and 154b.

However, the present invention is not limited to such a thin film transistor, and may similarly be applied to a thin film transistor having an extended number of first and second electrodes 152 and 154, that is, a thin film transistor T of which first electrode 152 has 2N+1 (N=natural number) sub electrodes and second electrode 154 has 2N sub electrodes.

For another example, the present invention may similarly be applied to a thin film transistor T of which first and second electrodes 152 and 154 have N sub electrodes (N=natural number more than 2).

Method for Manufacturing Thin Film Transistor Substrate

In a case of the method for manufacturing a thin film transistor substrate according to the second embodiment as compared with the method for manufacturing a thin film transistor substrate according to the first embodiment, the number of sub electrodes constituting the first electrode 152 and the number of sub electrodes constituting the second electrode 154 are changed, whereby the number of sub gate electrodes 175a constituting the second gate electrode, the number of connection electrodes 175b, and the number of openings 176 are changed. Since the method for manufacturing a thin film transistor substrate according to the second embodiment is the same as the method for manufacturing a thin film transistor substrate according to the first embodiment except for change in the number of electrodes and the number of openings, its detailed description will be omitted.

Organic Light Emitting Device

If the thin film transistor substrate according to the aforementioned embodiments is applied to an organic light emitting device, one or more switching thin film transistors and driving thin film transistors, which constitute the organic light emitting device, may be implemented using any one of the thin film transistors shown in FIGS. 2A, 2C, 2D, 4A, 4C, and 4D.

In this case, one or more switching thin film transistors and driving thin film transistors, which constitute the organic light emitting device, may be connected with each other through each line electrode.

It is to be understood by a person with ordinary skill in the art to which the present invention pertains that the present invention may be carried out in another detailed form without modification of technical spirits or essential features of the present invention.

For example, in the aforementioned embodiments, although the etch stopper layer is essentially required, the etch stopper layer may be omitted in the modified embodiments. In this case, the first electrode and the second electrode are directly formed on the active layer.

According to the present invention, the following advantages may be obtained.

As the first gate electrode is formed below the active layer and the second gate electrode is formed above the active, electrons may be transferred through the top and the bottom of the active layer, whereby output saturation characteristics of the thin film transistor may be improved, and the gap between transfer curves based on the voltage Vds between the drain and source electrodes of the thin film transistor within the subthreshold region may also be improved.

Also, according to the present invention, luminance uniformity, owing to improvement of the output characteristic and transfer characteristic of the thin film transistor, current capability of the thin film transistor, and compensation capability may be improved, and power consumption may also be reduced.

Also, according to the present invention, since the external light incident on the bottom and the top of the thin film transistor through the first gate electrode and the second gate electrode may be shielded, bias temperature stress (BTS) characteristics of the thin film transistor may be improved, and external gas ($O_2$) or water ($H_2O$), which flows towards the bottom and the top, may be shielded.

Also, according to the present invention, the electric field on the bottom and the top of the thin film transistor may be shielded through the first gate electrode and the second gate electrode, whereby local and global luminance uniformity may be improved and at the same time a bright/blind spot may be reduced.

Also, according to the present invention, as the overlap area between the second gate electrode and the drain electrode is reduced, short between the second gate electrode and the drain electrode may be avoided, and capacitance between the second gate electrode and the drain electrode may be reduced, whereby current efficiency may be increased.

Also, according to the present invention, after the etch stopper layer is formed on the entire surface of (for example, a line area and a thin film transistor except for an area where a storage capacitor is formed on the substrate) the substrate, since the etch stopper layer is patterned for contact between the source/drain electrodes and the active layer in accordance with a minimum design rule, the area of the source/drain electrodes overlapped with the gate electrode may be reduced, whereby on/off capacitance of the thin film transistor may be reduced.

Also, according to the present invention, since the etch stopper layer is formed even on left and right areas on the basis of the channel area on the active layer, it is advantageous in that the active layer may be protected by the etch stopper layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising a thin film transistor, the thin film transistor including:
    a first gate electrode formed on a substrate;
    an active layer formed on the first gate electrode;
    first and second electrodes formed on the active layer; and
    a second gate electrode formed on the first electrode, the second electrode, and the active layer,
    wherein the second gate electrode has an opening formed in an area corresponding to at least a part of the second electrode,
    wherein the second gate electrode includes:
        a plurality of sub gate electrodes formed on a channel area between the first and second electrodes; and
        one or more connection electrodes for connecting the plurality of sub gate electrodes with one another,
        wherein the opening of the second gate electrode corresponds to an area between the respective sub gate electrodes.

2. The thin film transistor substrate of claim 1, wherein the thin film transistor further includes a line electrode formed to be extended from the second electrode to electrically connect the thin film transistor with another circuit device, and the connection electrodes are formed to be overlapped with the line electrode.

3. The thin film transistor substrate of claim 1, wherein the thin film transistor further includes a line electrode formed to be extended from the second electrode to electrically connect the thin film transistor with another circuit device, and the connection electrodes are formed so as not to be overlapped with the line electrode.

4. The thin film transistor substrate of claim 1, wherein the thin film transistor further includes an etch stopper layer formed on the active layer, the etch stopper layer being provided with a first contact hole for contact between the active layer and the first electrode and a second contact hole for contact between the active layer and the second electrode.

5. The thin film transistor substrate of claim 1, wherein an overlap area between the second gate electrode and the second electrode has a size less than 10% of a size of the second gate electrode.

6. The thin film transistor substrate of claim 1, further comprising a contact portion for electrically connecting the first gate electrode with the second gate electrode.

7. The thin film transistor substrate of claim 6, wherein the contact portion is formed of the same material as that of the second gate electrode together with the second gate electrode.

8. The thin film transistor substrate of claim 1, wherein the first electrode includes two or more sub electrodes, the second electrode includes one or more sub electrodes, and the sub electrode constituting the second electrode is arranged between the sub electrodes constituting the first electrode.

9. The thin film transistor substrate of claim 1, wherein the second gate electrode is formed of a material whose transparency is higher than that of the first gate electrode.

10. An organic light emitting device comprising:
    a substrate;
    a first thin film transistor formed on the substrate;
    a second thin film transistor electrically connected with the first thin film transistor; and
    an organic light emitting diode connected with the first thin film transistor,
    wherein at least one of the first thin film transistor and the second thin film transistor includes:
    a first gate electrode formed on the substrate;
    an active layer formed on the first gate electrode;
    first and second electrodes formed on the active layer; and
    a second gate electrode formed on the first electrode, the second electrode, and the active layer and the second gate electrode having an opening formed in an area corresponding to at least a part of the second electrode,
    wherein the second gate electrode includes:
        a plurality of sub gate electrodes formed on a channel area between the first and second electrodes; and
        one or more connection electrodes for connecting the plurality of sub gate electrodes with one another, and
        the opening corresponds to an area between the respective sub gate electrodes.

11. The organic light emitting device of claim 10, wherein at least one of the first thin film transistor and the second thin film transistor further includes a line electrode formed to be extended from the second electrode to electrically connect the first thin film transistor and the second thin film transistor with each other, and the connection electrodes are formed to be overlapped with the line electrode.

12. The organic light emitting device of claim 10, wherein at least one of the first thin film transistor and the second thin film transistor further includes a line electrode formed to be extended from the second electrode to electrically connect the first thin film transistor and the second thin film transistor with each other, and the connection electrodes are formed so as not to be overlapped with the line electrode.

13. The organic light emitting device of claim 10, wherein at least one of the first thin film transistor and the second thin film transistor further comprises an etch stopper layer formed on the active layer, the etch stopper layer being provided with a first contact hole for contact between the active layer and the first electrode and a second contact hole for contact between the active layer and the second electrode.

14. The organic light emitting device of claim 10, wherein an overlap area between the second gate electrode and the second electrode has a size less than 10% of a size of the second gate electrode.

15. The organic light emitting device of claim 10, wherein at least one of the first thin film transistor and the second thin film transistor further comprises a contact portion for electrically connecting the first gate electrode with the second gate electrode.

16. The organic light emitting device of claim 15, wherein the contact portion is formed of the same material as that of the second gate electrode together with the second gate electrode.

17. The organic light emitting device of claim 10, wherein the first electrode includes two or more sub electrodes, the second electrode includes one or more sub electrodes, and the sub electrode constituting the second electrode is arranged between the sub electrodes constituting the first electrode.

18. The organic light emitting device of claim 10, wherein the second gate electrode is formed of a material whose transparency is higher than that of the first gate electrode.

* * * * *